(12) United States Patent
Schröder et al.

(10) Patent No.: US 6,967,370 B2
(45) Date of Patent: Nov. 22, 2005

(54) INTEGRATED SEMICONDUCTOR CIRCUIT HAVING A MULTIPLICITY OF MEMORY CELLS

(75) Inventors: Stephan Schröder, München (DE); Joerg Vollrath, Olching (DE); Tobias Hartner, Hamburg (DE)

(73) Assignee: Infineon Technologies, AG, (DE)

( * ) Notice: Subject to any disclaimer, the term of this patent is extended or adjusted under 35 U.S.C. 154(b) by 32 days.

(21) Appl. No.: 10/785,087

(22) Filed: Feb. 25, 2004

(65) Prior Publication Data
US 2004/0201051 A1 Oct. 14, 2004

(30) Foreign Application Priority Data
Feb. 28, 2003 (DE) .................. 103 08 924

(51) Int. Cl.$^7$ ............................. H01L 27/108
(52) U.S. Cl. ...................... 257/296; 257/301
(58) Field of Search .............. 257/296, 301, 257/773, 900, 905, 908

(56) References Cited

U.S. PATENT DOCUMENTS

| | | | |
|---|---|---|---|
| 6,281,586 B1 | 8/2001 | Feurle et al. | |
| 6,310,399 B1 | 10/2001 | Feurle et al. | |
| 2004/0196711 A1 * | 10/2004 | Vollrath et al. | 365/202 |
| 2004/0201051 A1 * | 10/2004 | Schroder et al. | 257/296 |

* cited by examiner

Primary Examiner—Mark V. Prenty
(74) Attorney, Agent, or Firm—Edell, Shapiro & Finnan, LLC

(57) ABSTRACT

An integrated semiconductor circuit can have memory cells, which can be read by word lines and bit lines. Two mutually adjacent bit lines in each case are connected to inputs of the same signal amplifier. In order to compensate for parasitic capacitors, which arise at thin sidewall insulations between the patterned word lines and adjacent bit line contacts, additional contact structures which lead past the word lines and represent dummy contacts can be provided. The additional parasitic capacitances produced by the dummy contact alter the electrical potential of the respective reference bit line at the signal amplifier like the parasitic capacitances of activated bit lines, as a result of which the measured differential potential can be corrected with respect to the parasitic effects.

7 Claims, 2 Drawing Sheets

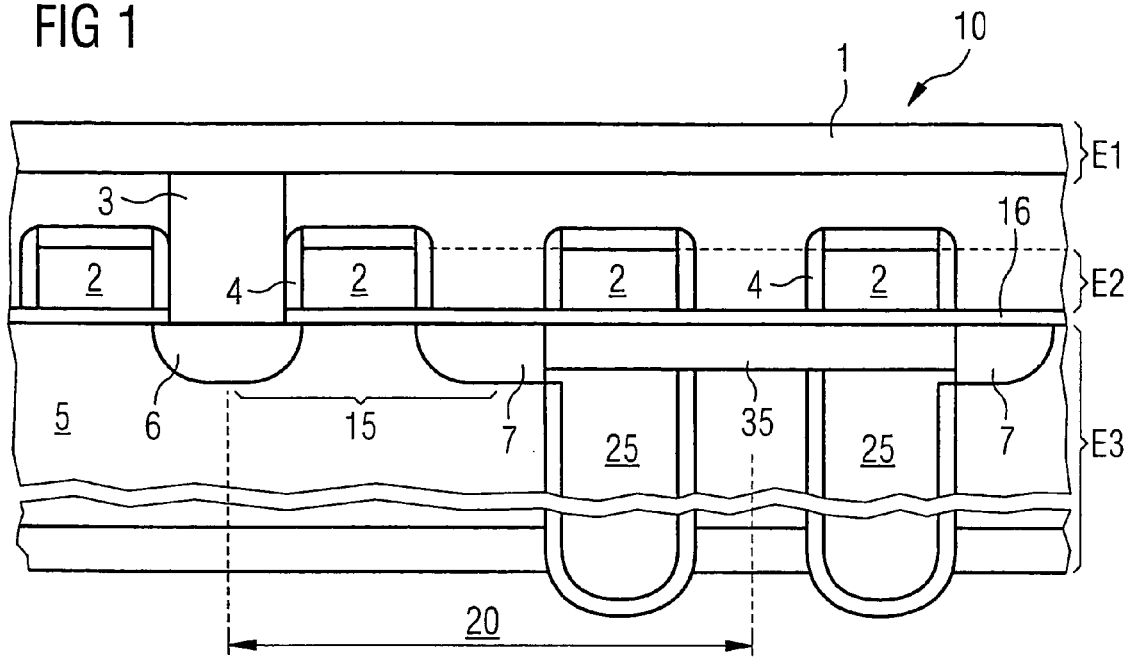
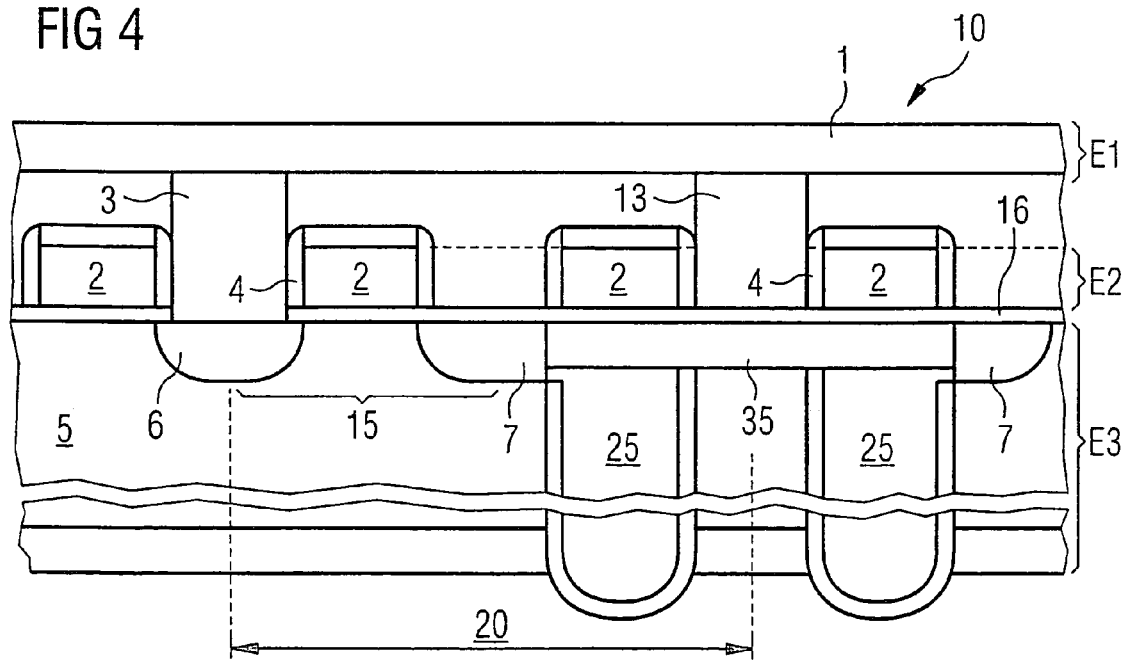

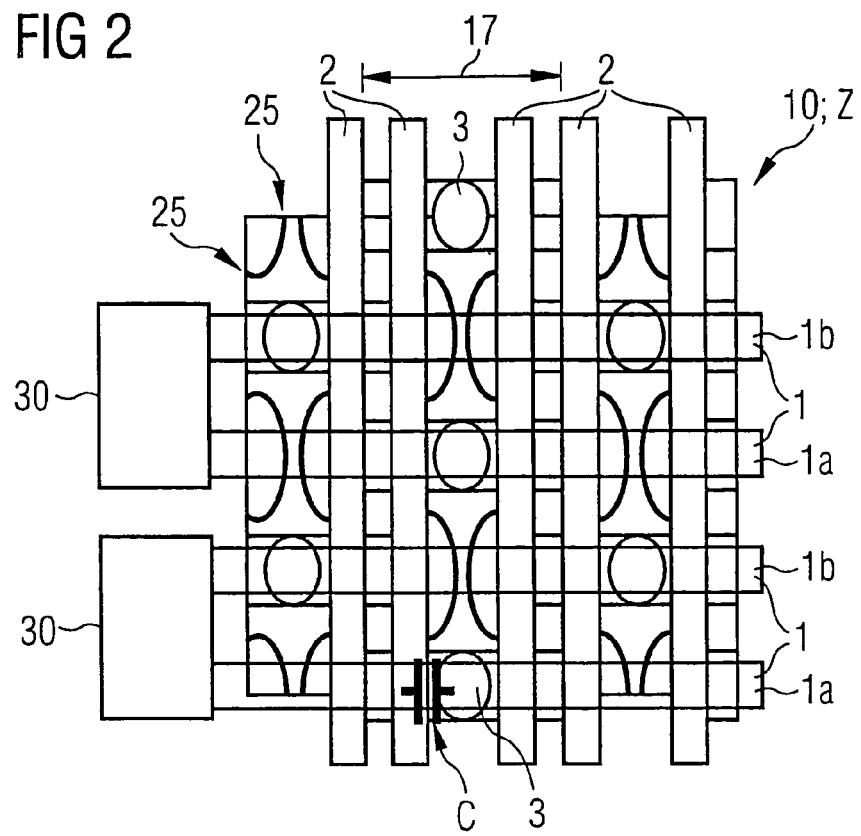
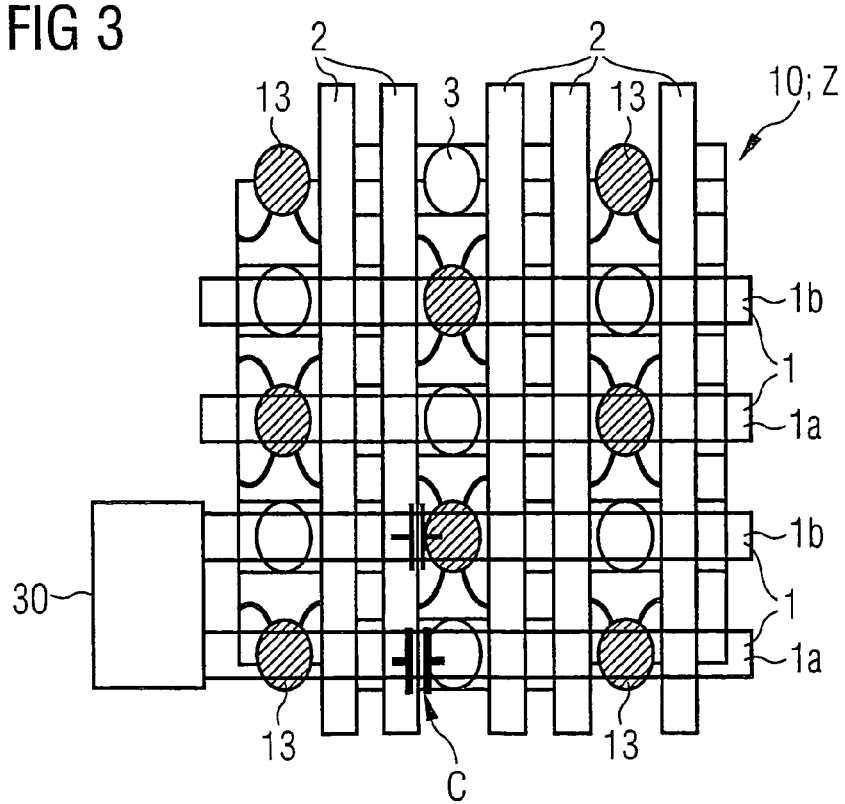

INTEGRATED SEMICONDUCTOR CIRCUIT HAVING A MULTIPLICITY OF MEMORY CELLS

CROSS REFERENCE TO RELATED APPLICATIONS

This application claims priority under 35 USC §119 to German Application No. 10308924.1, filed on Feb. 28, 2003, and titled "Integrated Semiconductor Circuit Having A Multiplicity Of Memory Cells," the entire contents of which are hereby incorporated by reference.

FIELD OF THE INVENTION

The invention relates to an integrated semiconductor circuit having a multiplicity of memory cells, which each have a selection transistor and a storage capacitor and can be driven electrically by bit lines and word lines.

BACKGROUND

In such semiconductor circuits, information items stored in the storage capacitors of the memory cells are read out by activation of the bit lines and word lines. The electrical potential of two bit lines are detected by a signal amplifier in order to identify a storage state. The signal amplifier (sense amplifier) acts as voltage differential amplifier which, after the potential of an opened bit line has been read, amplifies this signal and writes it back to the opened memory cell. In the case of the folded bit line construction of integrated semiconductor memories, when reading from one of two adjacent bit lines, the reference potential used is that of the respective other bit line.

Each memory cell is read by activation of a word line and then of a bit line, as a result of which, in the case of a field-effect transistor as selection transistor, the inversion channel produces the electrical connection between the storage capacitor, for example, a trench capacitor, and the bit line. The word line serves as gate electrode in the region of the transistor. One of the source/drain regions is conductively connected to the trench capacitor; the other source/drain region is electrically connected by a bit line contact to the bit line assigned to this transistor. The gate electrode, together with the gate oxide and a protective insulation layer, usually a nitride layer forms a patterned gate layer stack, the sidewalls of which are electrically insulated toward the side by means of a spacer, i.e., an insulating sidewall covering. The bit line contacts, which electrically connect the bit lines located at a higher level to the source/drain regions of the selection transistors, are arranged between mutually adjacent word lines equipped with spacers. The contact structures or bit line contacts thus connect an upper plane of the bit lines to a lower plane of the doping regions of the selection transistors and pass through a central plane in which the word lines are arranged.

In present-day semiconductor circuits, in particular, memory circuits, disturbance effects which disadvantageously affect the electrical switching behavior occur on account of the close spatial arrangement of a wide variety of structures. One disturbance factor is the lateral insulation of the word lines with respect to the contact structures or bit line contacts. The insulation is formed by the thin sidewall coverings of the word lines, as a result of which parasitic capacitances are formed.

During the read-out of a memory cell, both the word line and the bit line at whose crossover point the selection transistor of the memory cell is situated are activated. In this case, the electrical charge accumulated in the storage capacitor flows via the selection transistor out of the cell or is distributed between the cell and the connected bit line through to the signal amplifier. As a result, the electrical potential which is then present at the corresponding bit line terminal of the signal amplifier is attenuated with respect to the electrical potential of the charge previously stored in the memory transistor. Nevertheless, a potential difference remains measurable in comparison with another, usually adjacent bit line which is short-circuited with none of the connected storage capacitors.

This parasitic capacitance thus gives rise to an additional potential contribution which is superposed on the electrical potential which is expected on account of the capacitor capacitance and the bit line capacitance at the signal amplifier input. At the other input of the signal amplifier a non-activated bit line is present, in the case of which a comparable parasitic capacitance does not occur. Consequently, in the signal amplifier, the parasitic capacitance of the activated bit line is superposed on the potential difference of the two bit lines which is actually to be measured.

Such parasitic effects are conventionally compensated for by higher operating voltages and correspondingly higher quantities of charge of an integrated semiconductor circuit. However, this increases the current consumption, the heat supply and the space requirement of the integrated semiconductor circuit per memory cell.

SUMMARY

Eliminination of the influence of parasitic capacitances between bit line contacts and word lines without increasing the operating voltage of the semiconductor circuit is dsireable, in particular, reducing the influence of parasitic capacitances, which occur at sidewall coverings of patterned word lines with respect to adjacent contact structures of bit lines.

In the present invention, additional contact structures are provided, which lead past the word lines and represent dummy contacts, and in which case, for each contact structure which proceeds from a bit line, leads past a word line and connects the bit line to a memory cell. Also, a dummy contact, which proceeds from the adjacent bit line connected to the same signal amplifier and leads past the same word line as the respective contact structure, can be provided.

According to the invention, in addition to the contact structures which connect the bit line to the selection transistors, additional contract structures, i.e., dummy contacts; which lead past the same word line in each case, but in each case at the level of the adjacent bit line which is used as a reference bit line during read-out with the aid of the signal amplifier, can be provided. In addition to the grid including bit line contacts for reading from the memory cells, a second grid of dummy contacts that are arranged offset, can be provided so that either a contact structure required for read-out or a dummy contact leads past beside each crossover point between a bit line and a word line. Both can be insulated from the word lines by lateral insulation. Since each activated word line can not only lead past the bit line contact of the activated bit line but also leads past the dummy contact of the reference bit line, the electrical potential of the two bit lines connected to the same signal amplifier can be altered in the same way by the parasitic capacitance during read-out, so that the two disturbance effects compensate for one another.

The additional capacitance produced by the dummy contact can compensate for the parasitic capacitance of that bit line, which can be connected to the same signal amplifier. Consequently, the influence of the two capacitances can be equalized in the differential amplifier. As a result, a significant disturbance factor during the read-out of digital storage contents can be eliminated, and the excessively increased operating voltage conventionally used at least in the region of the cell array can be reduced; the reliability of the read-out result can increase.

Contact structures, which connect a bit line to a memory cell, and contact structures, which represent dummy contacts, can lead past alternately along a word line.

The storage capacitors can be trench capacitors formed in a semiconductor substrate, and the bit lines can be arranged on the semiconductor substrate at a greater distance from the semiconductor substrate than the word lines.

In particular, the dummy contacts in each case can end above a trench isolation, whereas the remaining contact structures in each case can lead into a common doping region of two selection transistors. The trench isolations can be situated beside the active regions of the substrate surface in which in each case one of two selection transistors can be opened by the activated word line and the activated bit line contact.

The selection transistors can be field-effect transistors, the gate electrodes of which can be formed by the word lines. In particular, the lateral insulations between the contact structures and the word lines can be sidewall coverings, i.e., spacers, of patterned gate layer stacks.

The semiconductor circuit formed according to the invention can be a dynamic random access memory, i.e., a DRAM.

BRIEF DESCRIPTION OF THE DRAWINGS

The invention is described below with reference to the figures, in which:

FIG. 1 shows a memory cell of an integrated semiconductor circuit,

FIG. 2 shows a conventional integrated semiconductor circuit,

FIG. 3 shows a semiconductor circuit according to the invention, and

FIG. 4 shows a cross-sectional view from FIG. 3.

DETAILED DESCRIPTION

FIG. 1 shows a memory cell 20 as is typically formed in the cell array of an integrated semiconductor memory 10 in the case of a buried capacitor 25 with planar selection transistor 15. The selection transistor cab be opened by activation of a word line 2, which forms the gate electrode of the transistor, and a bit line 1, which is connected to one of the source/drain regions 6 of the transistor via a contact structure 3. The trench capacitor 25 can have electrodes (not specifically designated), of which one can be buried deep in the substrate 5 and the other can form the filling of the deep trench within the capacitor dielectric at the trench wall. The storage capacitor can be situated essentially in a lower plane E3 extending down deep into the substrate interior. Above the substrate surface, on a gate oxide layer 16, the totality of the word lines 2 can be situated at the level of a plane E2, and the bit lines 1 can be situated in a higher plane E1. The contact structures 3 can be situated in the central plane E2, and can be laterally insulated from the word lines 2 by the spacers 4 thereof, as a result of which parasitic capacitances can form.

FIG. 2 shows a plan view of a conventional semiconductor circuit having a multiplicity of memory cells. Illustrated on the left are signal amplifiers (sense amplifiers) 30, two bit lines 1a, 1b in each case being connected to the inputs of the amplifiers. The word lines 2 run perpendicular to the bit lines, semicircular contours of the trench capacitors 25 located at a deeper level being discernible between the word lines. The contact structures 3 extend at the level of the word lines 2, which contact structures connect a bit line running above the plane of the drawing to a common source/drain doping region of two memory cells or selection transistors which are adjacent in the bit line direction. The active region of the two selection transistors is indicated by the double arrow 17. The active regions form a diagonal grid corresponding to the grid of the bit line contacts or contact structures 3 illustrated. During the read-out of a memory cell, the assigned bit line is activated and read with the adjacent bit line at the common signal amplifier. The activated bit line is parasitically coupled via the bit line contact to the activated word line which has been opened for the read-out of the corresponding memory cell. A parasitic capacitance arises as a result, as illustrated by the indicated capacitance symbol C and the symbol of a plate capacitor for example at the crossover point between the second word line from the left and the bit line contact of the bottom-most bit line. The adjacent bit line (the second bit line from the bottom) does not have such a parasitic capacitance, for which reason the parasitic capacitance C at the lower bit line corrupts the electrical potential difference between the two bit lines.

FIG. 3 shows a semiconductor circuit according to the invention, in which, in addition to the bit line contacts 3 serving for the read-out of memory cells, contact structures 13 can be provided, which represent dummy contacts, which lead past the word lines 2 like bit line contacts 3, but can end on or above a trench isolation or another insulating structure. Consequently, the dummy contacts do not have a circuitry function; however, the dummy contacts can serve for forming compensating parasitic capacitances of the respective reference bit line. In FIG. 3, the parasitic capacitances of the two bit lines 1a and 1b connected to the same signal amplifier 30 are illustrated by the symbol of a plate capacitor.

Computationally, the electrical potential of a bit line is generally determined according to the equation $$Vbl = (Vc - Vbleq)Cc/(Cc + Cbl) + Vwl,$$

where Vbl denotes the measured potential of the bit line, Vc denotes the electrical potential of the memory cell, Vbleq denotes the averaged potential of a bit line between on state and off state (the arithmetic mean of the two potentials), Cc denotes the capacitance of the memory cell, Cbl denotes the capacitance of the bit line, and Vwl denotes the potential shift on account of the parasitic capacitor. The last term Vwl leads to the super position and disturbance of the bit line potential to be measured. In the case of the semiconductor circuit according to the invention as shown in FIG. 3, however, this term Vwl also occurs on the adjacent reference bit line, i.e., between the same activated word line 12 and the adjacent dummy contact 13. The two capacitances C can lead to identical terms Vwl in the above equation, which can compensate for one another in the comparison of the two bit line potentials. The bit line potential of the selected memory cell measured in the signal amplifier can corresponds to a bit line potential $$Vbl = (Vc - Vbleq)Cc/(Cc + Cbl).$$

On account of the compensation according to the invention, the conventional excessive voltage increases of the order of magnitude of about 300 mV can be obviated; the current consumption of the semiconductor circuit can decrease.

FIG. 4 shows the semiconductor circuit according to the invention from FIG. 3 in a partial cross-sectional view along one of the bit lines 1 in FIG. 3. The illustrated section along the bit line 1 extends over the dimensions of two adjacent memory cells 20 as in FIG. 1. In FIG. 1, the bit line can be connected by a contact structure 3 to a common source/drain region of two selection transistors. In addition, however, a further contact structure, the dummy contact 13, is arranged between further word lines (passing word lines) arranged above the storage capacitors, which contact, although it makes contact with the bit line at the top, ends at the bottom on the gate oxide 16 or directly on a trench isolation 35. The dummy contact does not have a circuitry function. However, the dummy contact can be formed such that it is isolated from the adjacent word lines 2, like the bit line contacts 3, by a thin sidewall oxide 4. If the bit line 1 represented in FIG. 4 is the first of two bit lines connected to a common signal amplifier, then FIG. 4 simultaneously corresponds to a section along the adjacent, second bit line connected to the signal amplifier, but offset in the bit line direction by the dimension of a memory cell 20. The sectional view, which is illustrated in FIG. 4, in the region of a specific word line 2 in the cross section of the first bit line corresponds to the sectional view, which is illustrated in FIG. 4, in the region of the next but one word line 2 in the cross section through the second bit line, and vice versa. The left-hand and right-hand halves from FIG. 4 can be repeated perpendicular to the plane of the drawing, so that bit line contacts 3 and dummy contacts 13 can succeed one another in an alternate sequence along an arbitrary word line 2 perpendicular to the plane of the drawing. The electrical potentials of the two bit lines can be influenced by a parasitic capacitance in the same way upon activation of a word line. The two influences can cancel one another out during the differential measurement in the signal amplifier.

The semiconductor circuit formed according to the invention thus can enable a more reliable read-out of digital information items stored in the storage capacitors and the reliable evaluation of the information items as either digital zero or digital one. The additional parasitic capacitances produced by the dummy contacts can alter the electrical potential of the respective reference bit line at the signal amplifier in the same way as the parasitic capacitances of activated bit lines, as a result of which the measured differential potential is corrected with respect to the parasitic effects.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 1, 1a, 1b Bit lines
2 Word lines
3 Contact structure (bit line contact)
4 Sidewall insulation
5 Semiconductor substrate
6 Common source/drain region
7 Source/drain region on trench side
10 Semiconductor circuit
13 Additional contact structure (dummy contact)
15 Selection transistor
16 Gate oxide
17 Double arrow
20 Memory cell
25 Storage capacitor
30 Signal amplifier
35 Trench isolation
C Parasitic capacitance
E1, E2, E3 Planes
Z Cell region

We claim:

1. An integrated semiconductor circuit, comprising:
plurality of memory cells each memory cell having a selection transistor and a storage capacitor, each memory cell being driven electrically by bit lines and word lines; and
a plurality of electrical contact structures being arranged at the level of the word lines, the contact structures electrically connecting the bit lines to the selection transistors of the memory cells the contact structures leading past the word lines and being insulated from the word lines by lateral insulations, and in each case two, mutually adjacent bit lines being connected to a common signal amplifier,
wherein additional contact structures are provided, the additional contact structures leading past the word lines, the additional contact structures representing dummy contacts, in which case, for each contact structure which proceeds from a bit line leads past a word line, and connects the bit line to a memory cell, a dummy contact, which proceeds from the adjacent bit line connected to the signal amplifier and leads past the same word line as the respective contact structure is provided.

2. The semiconductor circuit as claimed in claim 1, wherein the contact structures, which connect a bit line to a memory cell, and the contact structures, which represent dummy contacts, lead past alternately along a word line.

3. The semiconductor circuit as claimed in claim 1, wherein the storage capacitors are trench capacitors arranged in a semiconductor substrate, and the bit lines are arranged on the semiconductor substrate at a greater distance from the semiconductor substrate than the word lines.

4. The semiconductor circuit as claimed in claim 1, wherein the dummy contacts in each case end above a trench isolation, whereas the remaining contact structures in each case lead into a common doping region of two selection transistors.

5. The semiconductor circuit as claimed in claim 1, wherein the selection transistors are field-effect transistors, the gate electrodes of which are formed by the word lines.

6. The semiconductor circuit as claimed in claim 1, wherein the lateral insulations between the contact structures and the word lines are sidewall coverings of patterned gate layer stacks.

7. The semiconductor circuit as claimed in claim 1, wherein the semiconductor circuit is a dynamic random access memory.

* * * * *